US011654526B2

(12) United States Patent
Miyasaka et al.

(10) Patent No.: US 11,654,526 B2
(45) Date of Patent: May 23, 2023

(54) POLISHING PAD AND METHOD FOR MANUFACTURING SAME

(71) Applicant: Fujibo Holdings, Inc., Tokyo (JP)

(72) Inventors: Hirohito Miyasaka, Saijo (JP); Teppei Tateno, Saijo (JP); Ryuma Matsuoka, Saijo (JP); Hiroshi Kurihara, Saijo (JP); Takumi Mikuni, Saijo (JP)

(73) Assignee: Fujibo Holdings, Inc., Tokyo (JP)

( * ) Notice: Subject to any disclaimer, the term of this patent is extended or adjusted under 35 U.S.C. 154(b) by 494 days.

(21) Appl. No.: 16/650,597

(22) PCT Filed: Oct. 12, 2018

(86) PCT No.: PCT/JP2018/038099
§ 371 (c)(1),
(2) Date: Mar. 25, 2020

(87) PCT Pub. No.: WO2019/074098
PCT Pub. Date: Apr. 18, 2019

(65) Prior Publication Data
US 2020/0230780 A1     Jul. 23, 2020

(30) Foreign Application Priority Data

Oct. 12, 2017 (JP) .............................. JP2017-198435

(51) Int. Cl.
*B24B 37/24* (2012.01)
*B24B 37/26* (2012.01)
(Continued)

(52) U.S. Cl.
CPC .............. *B24B 37/24* (2013.01); *B24B 37/00* (2013.01); *B24B 37/26* (2013.01); *B24D 3/28* (2013.01); *H01L 21/304* (2013.01)

(58) Field of Classification Search
CPC .................................. B24B 37/24; B24D 3/28
See application file for complete search history.

(56) References Cited

U.S. PATENT DOCUMENTS 6,454,634 B1 * 9/2002 James ...................... B24B 37/26
                                                                451/36
6,736,709 B1    5/2004 James et al.
(Continued)

FOREIGN PATENT DOCUMENTS

CN          102448669 A      5/2012
CN          104942702 A      9/2015
(Continued)

OTHER PUBLICATIONS

Extended European Search Report dated Jun. 11, 2021, by the European Patent Office in corresponding European Patent Application No. 18/867,218 2. (7 pages).
(Continued)

*Primary Examiner* — Binh X Tran
(74) *Attorney, Agent, or Firm* — Buchanan, Ingersoll & Rooney PC

(57) ABSTRACT

A polishing pad includes: a polishing layer having a polyurethane sheet containing substantially spherical cells, wherein E'(90%)/E'(30%) falls within a range of 0.4 to 0.7, where E'(90%) represents a storage modulus of the polyurethane sheet that has been exposed to an environment with a temperature of 23° C. and a relative humidity of 90%, as measured in a tension mode at 40° C. with an initial load of 148 g, a strain range of 0.1%, and a measurement frequency of 1.6 Hz, and E'(30%) represents a storage modulus of the polyurethane sheet that has been exposed to an environment with a temperature of 23° C. and a relative humidity of 30%, as measured in a tension mode at 40° C. with an initial load of 148 g, a strain range of 0.1%, and a measurement frequency of 1.6 Hz. Also provided is a method for manufacturing the polishing pad.

5 Claims, 3 Drawing Sheets

(51) Int. Cl.
  *B24D 3/28* (2006.01)
  *H01L 21/304* (2006.01)
  *B24B 37/00* (2012.01)

(56) References Cited

U.S. PATENT DOCUMENTS

| | | |
|---|---|---|
| 6,749,485 B1 | 6/2004 | James et al. |
| 6,860,802 B1 | 3/2005 | Vishwanathan et al. |
| 2003/0027500 A1 | 2/2003 | James et al. |
| 2005/0020082 A1 | 1/2005 | Vishwanathan et al. |
| 2005/0079806 A1 | 4/2005 | James et al. |
| 2011/0130077 A1 | 6/2011 | Litke et al. |
| 2015/0174726 A1 | 6/2015 | Litke et al. |
| 2015/0273652 A1 | 10/2015 | Qian et al. |
| 2016/0136787 A1* | 5/2016 | Bajaj .................... B24D 11/001 51/298 |
| 2017/0014970 A1* | 1/2017 | Itoyama ............. C08G 18/6674 |

FOREIGN PATENT DOCUMENTS

| | | |
|---|---|---|
| CN | 106163741 A | 11/2016 |
| EP | 3 127 655 A1 | 2/2017 |
| JP | 2004507076 A | 3/2004 |
| JP | 2004165408 A | 6/2004 |
| JP | 2005136400 A | 5/2005 |
| JP | 2016064455 A | 4/2016 |
| WO | WO-2015151784 A1 * 10/2015 ............. B24B 37/24 |

OTHER PUBLICATIONS

International Search Report (PCT/ISA/210) and an English translation thereof, and Written Opinion (PCT/ISA/237) dated Dec. 25, 2018, by the Japanese Patent Office as the International Searching Authority for International Application No. PCT/JP2018/038099.
Office Action and Search Report dated Jun. 7, 2021, by the China National Intellectual Property Administration in corresponding Chinese Patent Application No. 201880066479.5, (7 pages).

* cited by examiner

POLISHING PAD AND METHOD FOR MANUFACTURING SAME

TECHNICAL FIELD

The present invention relates to a polishing pad and a method for manufacturing the same. In particular, the present invention relates to a polishing pad for a chemical-mechanical polishing (CMP) process for optical materials, semiconductor devices, hard disk substrates, and the like, and a method for manufacturing the same.

BACKGROUND ART

Since the surfaces of materials such as silicon, hard disk substrates, mother glasses for thin liquid crystal displays, semiconductor wafers, and semiconductor devices are required to have planarity, loose abrasive polishing using a polishing pad is conducted. The loose abrasive method is a method for polishing a machined surface of a material to be polished while supplying a slurry (a polishing liquid or a polishing slurry) containing abrasives between the polishing pad and the material to be polished.

The polishing pad for semiconductor devices requires pores for holding a polishing slurry, hardness for maintaining the planarity of the surface of the semiconductor device, and elasticity for preventing the surface of the semiconductor device from being scratched, on the surface of the polishing pad. As a polishing pad that meets these requirements, a polishing pad having a polishing layer manufactured from a urethane resin foam has been utilized.

The urethane resin foam is normally cured and molded by reacting a prepolymer containing a polyurethane bond-containing isocyanate compound with a curing agent (a dry method). Then, by slicing this foam into the form of sheets, the polishing pad is formed. Regarding a polishing pad having a hard polishing layer that is molded by the dry method as above (hereinafter, sometimes abbreviated as a hard (dry) polishing pad), since relatively small, substantially spherical cells are formed inside the foam during curing and molding of a urethane resin, pores (openings) that are capable of holding the slurry during the polishing are formed in the polishing surface of the polishing pad formed by the slicing.

Conventionally, it has been known to use values such as storage modulus (F) and KEL measured using the dynamic mechanical analysis (DMA) as indices indicating the properties of polishing pads (Patent Literatures 1 and 2).

Patent Literature 1 discloses a polishing pad that has storage modulus (F) measured by DMA, the E ratio at 30° C./90° C., the energy loss factor (KEL), and other factors being set within predetermined ranges in order to reduce dishing of semiconductor devices. Patent Literature 2 discloses a polishing pad that has achieved planarization performance and low defectivity performance by setting KEL and E' at a frequency different from that in Patent Literature 1 (Patent Literature 1: 10 radian/second, and Patent Literature 2: 1 radian/second) within specific ranges. Moreover, as a polishing pad that meets these indices, polishing pads such as IC1000 (Registered Trademark, manufactured by Nitta Haas Incorporated) have been known, for example.

CITATION LIST

Patent Literatures

Patent Literature 1: Japanese Translation of PCT International Application No. 2004-507076

Patent Literature 2: Japanese Patent Application Publication No. 2005-136400

SUMMARY OF INVENTION

Problems to be Solved by the Invention

However, although having high planarization performances, the polishing pads described in Patent Literatures 1 and 2 still exhibit insufficient scratch performance in the case where more precise polishing is demanded.

The present invention has been made in view of the above-described problem, and has an object to provide a polishing pad and a method for manufacturing the same that are capable of reducing generation of scratches while maintaining a high polishing rate.

Means for Solution of the Problems

As a result of earnest studies, the present inventor found that it is possible to reduce generation of scratches on the surface of a material to be polished while maintaining a high polishing rate by using a polishing pad in which the storage modulus of a polyurethane sheet under a high humidity condition is sufficiently smaller than the storage modulus of the polyurethane sheet under a low humidity condition. The present invention to solve the above-described problems includes aspects described below.

(1) A polishing pad comprising:
a polishing layer having a polyurethane sheet containing substantially spherical cells, wherein
$E'(90\%)/E'(30\%)$ falls within a range of 0.4 to 0.7,
where
$E'(90\%)$ represents a storage modulus of the polyurethane sheet that has been exposed to an environment with a temperature of 23° C. and a relative humidity of 90%, as measured in a tension mode at 40° C. with an initial load of 148 g, a strain range of 0.1%, and a measurement frequency of 1.6 Hz, and
$E'(30\%)$ represents a storage modulus of the polyurethane sheet that has been exposed to an environment with a temperature of 23° C. and a relative humidity of 30%, as measured in a tension mode at 40° C. with an initial load of 148 g, a strain range of 0.1%, and a measurement frequency of 1.6 Hz.
(2) The polishing pad according to (1), wherein
$KEL(90\%)/KEL(30\%)$ falls within a range of 2 to 4,
where
$KEL(90\%)$ represents KEL of the polyurethane sheet that has been exposed to an environment with a temperature of 23° C. and a relative humidity of 90%, as measured in a tension mode at 40° C. with an initial load of 148 g, a strain range of 0.1%, and a measurement frequency of 1.6 Hz, and
$KEL(30\%)$ represents KEL of the polyurethane sheet that has been exposed to an environment with a temperature of 23° C. and a relative humidity of 30%, as measured in a tension mode at 40° C. with an initial load of 148 g, a strain range of 0.1%, and a measurement frequency of 1.6 Hz.
(3) The polishing pad according to (1) or (2), wherein $E'(30\%)$ of the polyurethane sheet is 280 to 600 MPa.
(4) The polishing pad according to any one of (1) to (3), wherein
$KEL(90\%)$ of the polyurethane sheet is 450 to 1500 (1/Pa).
(5) The polishing pad according to any one of (1) to (4), wherein the polyurethane sheet contains hollow bodies having an average particle size of 10 to 150 μm.

The polishing pad of the present invention is capable of reducing generation of scratches while maintaining a high polishing rate.

DESCRIPTION OF EMBODIMENTS

Figure 1:
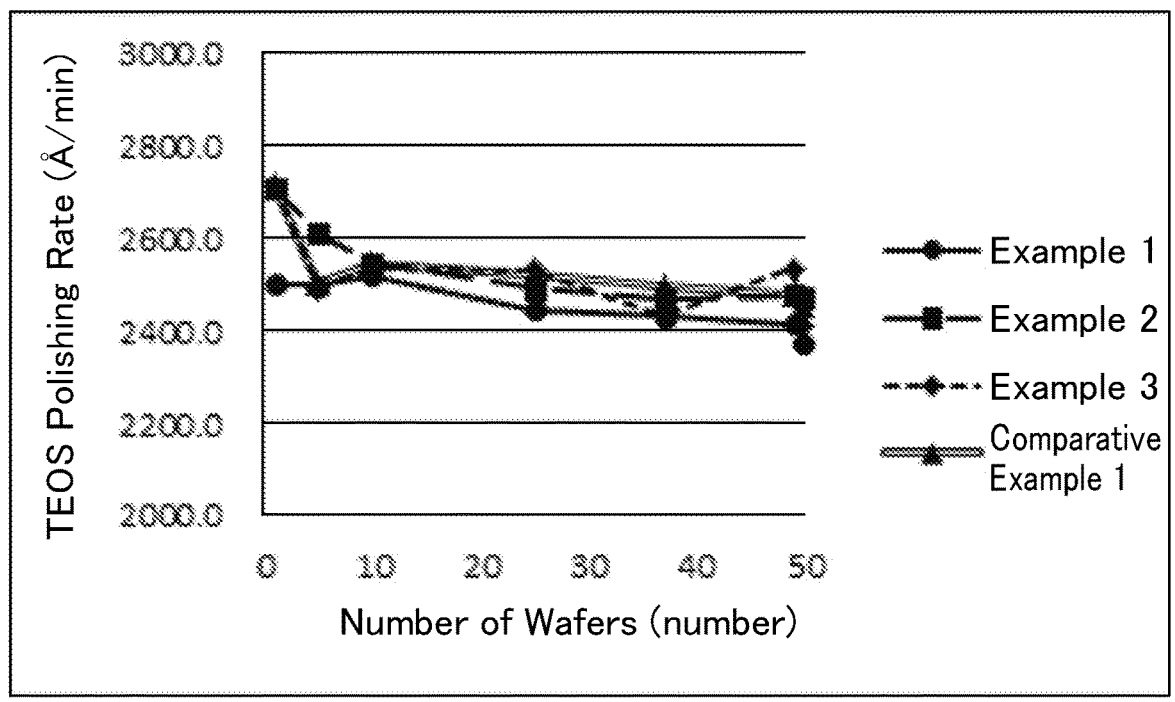
FIG. 1 is a graph illustrating polishing rates at predetermined numbers of substrates when 50 TEOS film substrates were polished using polishing pads of Examples 1 to 3 and Comparative Example 1.

Hereinafter, modes for carrying out the present invention are described.

<<Polishing Pad>>

The polishing pad of the present invention is a polishing pad comprising: a polishing layer having a polyurethane sheet containing substantially spherical cells, wherein E'(90%)/E'(30%) falls within a range of 0.4 to 0.7, where E'(90%) represents a storage modulus of the polyurethane sheet that has been exposed to an environment with a temperature of 23° C. and a relative humidity of 90%, as measured in a tension mode at 40° C. with an initial load of 148 g, a strain range of 0.1%, and a measurement frequency of 1.6 Hz, and E'(30%) represents a storage modulus of the polyurethane sheet that has been exposed to an environment with a temperature of 23° C. and a relative humidity of 30%, as measured in a tension mode at 40° C. with an initial load of 148 g, a strain range of 0.1%, and a measurement frequency of 1.6 Hz.

The polyurethane sheet means a sheet-shaped resin having at least two or more urethane bonds in a molecule thereof. The polyurethane sheet preferably has at least two or more urethane bonds and at least two or more urea bonds in a molecule thereof. The polyurethane sheet and the polishing pad including the sheet of the present invention can be manufactured, for example, in accordance with a manufacturing method of the present invention, which is described later.

In addition, the term "substantially spherical" is a concept meaning a normal cell shape present in a molded body which is formed by using a dry method (having isotropy and being a spherical shape, an ellipsoidal shape, or a shape similar to these), and is used to be distinguished from a cell shape contained in a molded body which is formed by using a wet method (having anisotropy and having a structure in which the diameter increases from the surface of the polishing layer of the polishing pad toward the bottom portion). Hence, the polyurethane sheet containing substantially spherical cells may be restated with a polyurethane sheet molded by the dry method.

Definitions

In the Specification and the Claims, the storage modulus (E') and the loss modulus (E'') are a storage modulus and a loss modulus in a tension mode at 23° C. with an initial load of 148 g, a strain range of 0.1%, and a measurement frequency of 1.6 Hz pursuant to JIS K7244-4, respectively.

In addition, in the Specification and the Claims, tan δ is the ratio of the loss modulus to the storage modulus and is defined as follows:

$$\tan \delta = E''/E'.$$

In addition, in the Specification and the Claims, the energy loss factor (KEL, unit: 1/Pa) is defined by the following equation using tan δ and the storage modulus (E'):

$$KEL = \tan \delta \times 10^{12}/(E' \times (1 + \tan \delta^2)),$$

where E' is in pascal unit.

In the Specification and the Claims, the polyurethane sheet that "has been exposed to an environment with a temperature of 23° C. and a relative humidity of 90%" means a polyurethane sheet that has been placed in a constant-temperature and constant-humidity chamber with a temperature of 23° C. and a relative humidity of 90% for 40 hours or more. This polyurethane sheet is taken out of the constant-temperature and constant-humidity chamber immediately before measurement of the storage modulus and KEL (preferably, within 1 minute before the measurement).

Similarly, the polyurethane sheet that "has been exposed to an environment with a temperature of 23° C. and a relative humidity of 30%" means a polyurethane sheet that has been placed in a constant-temperature and constant-humidity chamber with a temperature of 23° C. and a relative humidity of 30% for 40 hours or more. This polyurethane sheet is taken out of the constant-temperature and constant-humidity chamber immediately before measurement of the storage modulus and KEL (preferably, within 1 minute before the measurement).

(Storage Modulus (E'))

The polishing pad of the present invention is such that E'(90%)/E'(30%) is within a range of 0.4 to 0.7, where E'(90%) represents a storage modulus of the polyurethane sheet that has been exposed to an environment with a temperature of 23° C. and a relative humidity of 90%, as measured in a tension mode at 40° C. with an initial load of 148 g, a strain range of 0.1%, and a measurement frequency of 1.6 Hz, and E'(30%) represents a storage modulus of the polyurethane sheet that has been exposed to an environment with a temperature of 23° C. and a relative humidity of 30%, as measured in a tension mode at 40° C. with an initial load of 148 g, a strain range of 0.1%, and a measurement frequency of 1.6 Hz. E'(90%)/E'(30%) is preferably within a range of 0.45 to 0.65 and more preferably within a range of 0.5 to 0.62.

When E'(90%)/E'(30%) is within the above-described ranges, it is possible to reduce generation of scratches while maintaining a high polishing rate.

In the polishing pad of the present invention, the storage modulus E'(30%) of the polyurethane sheet is preferably 280 to 600 MPa, more preferably 300 to 550 MPa, and even more preferably 310 to 530 MPa.

In the polishing pad of the present invention, the storage modulus E'(90%) of the polyurethane sheet is preferably 100 to 400 MPa, more preferably 120 to 350 MPa, and even more preferably 150 to 300 MPa.

(Energy Loss Factor (KEL))

The polishing pad of the present invention is preferably such that KEL(90%)/KEL(30%) is within a range of 2 to 4, where KEL(90%) represents KEL of the polyurethane sheet that has been exposed to an environment with a temperature of 23° C. and a relative humidity of 90%, as measured in a tension mode at 40° C. with an initial load of 148 g, a strain range of 0.1%, and a measurement frequency of 1.6 Hz, and KEL(30%) represents KEL of the polyurethane sheet that has been exposed to an environment with a temperature of 23° C. and a relative humidity of 30%, as measured in a tension mode at 40° C. with an initial load of 148 g, a strain range of 0.1%, and a measurement frequency of 1.6 Hz. KEL(90%)/KEL(30%) is more preferably within a range of 2.5 to 4.0 and even more preferably within a range of 2.8 to 3.8.

When KEL(90%)/KEL(30%) is within the above-described ranges, it is possible to reduce generation of scratches while maintaining a high polishing rate.

In the polishing pad of the present invention, KEL(90%) of the polyurethane sheet is preferably 450 to 1500 (1/Pa), more preferably 500 to 1300 (1/Pa), and even more preferably 550 to 1200 (1/Pa).

In the polishing pad of the present invention, KEL(30%) of the polyurethane sheet is preferably 100 to 450 (1/Pa), more preferably 120 to 400 (1/Pa), and even more preferably 150 to 360 (1/Pa).

(Hollow Body)

In the Specification and the Claims, the hollow body means a substantially spherical microsphere having a void. The substantially spherical microsphere includes those having a spherical shape, an ellipsoidal shape, and a shape similar to these. Examples of the hollow body include those obtained by heating and expanding an unfoamed heat-expandable microsphere composed of an outer shell (a polymer shell) made of a thermoplastic resin and a low boiling point hydrocarbon enclosed in the outer shell.

As the polymer shell, for example, a thermoplastic resin such as an acrylonitrile-vinylidene chloride copolymer, an acrylonitrile-methyl methacrylate copolymer, or a vinyl chloride-ethylene copolymer may be used as disclosed in Japanese Patent Application Publication No. Sho 57-137323 or the like. Also, as the low boiling point hydrocarbon enclosed in the polymer shell, for example, isobutane, pentane, isopentane, petroleum ether, or the like may be used.

In the polishing pad of the present invention, the polyurethane sheet preferably contains hollow bodies having an average particle size of 10 to 150 μm. The average particle size of the hollow bodies is more preferably 15 to 130 μm, even more preferably 20 to 100 μm, further more preferably 20 to 60 μm, and particularly preferably 30 to 50 μm.

Containing the hollow bodies makes it possible to hold a polishing slurry during polishing, contributing to the polishing of a material to be polished.

Note that the average particle size can be measured using a laser diffraction particle size distribution measurement device (for example, Mastersizer 2000 manufactured by Spectris plc).

(Thickness)

The thickness of the polyurethane sheet in the polishing pad of the present invention is not particularly limited, but a usable range may be, for example, 0.5 to 3.0 mm, preferably 0.5 to 2.0 mm, and more preferably 1.0 to 1.5 mm.

(Constituents of Polyurethane Resin)

In the Specification and the Claims, the constituents of the polyurethane resin mean raw material components of the polyurethane resin, which are incorporated as parts of a chain constituting the polyurethane resin by the following polymerization reaction.

The constituent of the polyurethane resin constituting the polyurethane sheet in the polishing pad of the present invention includes raw material components of the polyurethane resin, that is, a polyisocyanate component, a polyol component, and a polyamine component as an optional component. The polyisocyanate component includes (B) a polyisocyanate compound which is described later. The polyol compound includes (C) a polyol compound and (D-2) a polyol compound that may be used after synthesis of a prepolymer. The polyamine component includes (D-1) a polyamine compound.

The polyurethane sheet in the polishing pad of the present invention preferably contains poly(oxytetramethylene) glycol having a number average molecular weight of 500 to 1500 as the polyol component constituting the polyurethane resin. The number average molecular weight of the poly(oxytetramethylene) glycol is more preferably 600 to 1300 and even more preferably 650 to 1000.

The polishing pad of the present invention is used for polishing optical materials, semiconductor devices, glass substrates for hard disks, and the like, and particularly favorably used for performing chemical-mechanical polishing (CMP) on devices in which an oxide layer or a metal layer such as a copper is formed on a semiconductor wafer.

The polishing pad of the present invention can be obtained by the following manufacturing method, for example.

<<Method for Manufacturing Polishing Pad>>

The manufacturing method of the present invention includes a step (mixing step) of mixing at least a polyurethane bond-containing isocyanate compound (A) as a prepolymer and a curing agent (D) to obtain a mixture liquid for forming a molded body; and a step (molded body-forming step) of forming a polyurethane resin-molded body from the mixture liquid for forming a molded body to obtain a polyurethane sheet.

Hereinafter, each step is described.

<Mixing Step>

In the mixing step, at least a polyurethane bond-containing isocyanate compound (A) and a curing agent (D) are mixed as raw materials of the polyurethane sheet. In addition, a component other than those above may be used in combination as long as these component does not hinder the effects of the present invention.

Hereinafter, each component is described.

[(A) Polyurethane Bond-Containing Isocyanate Compound]

The polyurethane bond-containing isocyanate compound (A) as the prepolymer (hereinafter, sometimes referred to as component (A)) is a compound obtained by reacting a polyisocyanate compound (B) and a polyol compound (C) described below under usually used conditions, and contains a polyurethane bond and an isocyanate group in a molecule thereof. In addition, another component may be contained in the polyurethane bond-containing isocyanate compound as long as the component does not hinder the effects of the present invention.

As the polyurethane bond-containing isocyanate compound (A), a commercially available one may be used or one synthesized by reacting a polyisocyanate compound and a polyol compound may be used. The above reaction is not particularly limited, and an addition polymerization reaction may be performed using publicly-known method and conditions in the manufacture of a polyurethane resin. For example, the polyurethane bond-containing isocyanate compound (A) may be manufactured by a method including: adding a polyisocyanate compound heated to 50° C. to a polyol compound heated to 40° C. while agitating under a nitrogen atmosphere; and increasing the temperature to 80° C. after 30 minutes, followed by further reacting at 80° C. for 60 minutes.

[(B) Polyisocyanate Compound]

In the Specification and the Claims, the polyisocyanate compound means a compound having two or more isocyanate groups in a molecule thereof.

The polyisocyanate compound (B) (hereinafter, sometimes referred to as component (B)) is not particularly limited as long as the compound has two or more isocyanate groups in a molecule thereof. For example, diisocyanate compounds having two isocyanate groups in a molecule thereof include m-phenylene diisocyanate, p-phenylene diisocyanate, 2,6-tolylene diisocyanate (2,6-TDI), 2,4-tolylene diisocyanate (2,4-TDI), naphthalene-1,4-diisocyanate, diphenylmethane-4,4'-diisocyanate (MDI), 4,4'-methylenebis(cyclohexyl isocyanate) (hydrogenated MDI), 3,3'-dimethoxy-4,4'-biphenyl diisocyanate, 3,3'-dimethyl diphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, p-phenylene diisothiocyanate, xylylene-1,4-diisothiocyanate, ethylidyne diisothiocyanate, and the like.

As the polyisocyanate compound, diisocyanate compounds are preferable. Among these, 2,4-TDI, 2,6-TDI, and MDI are more preferable, and 2,4-TDI and 2,6-TDI are particularly preferable.

These polyisocyanate compounds may be used alone or a plurality of the polyisocyanate compounds may be used in combination.

[(C) Polyol Compound]

In the Specification and the Claims, the polyol compound means a compound having two or more alcoholic hydroxyl groups (OHs) in a molecule thereof.

The polyol compound (C) used for synthesizing the polyurethane bond-containing isocyanate compound as the prepolymer (hereinafter, sometimes referred to as component (C)) includes diol compounds, triol compounds, and the like such as ethylene glycol, diethylene glycol (DEG), and butylene glycol; polyether polyol compounds such as polypropylene glycol (PPG) and poly(oxytetramethylene) glycol (PTMG); polyester polyol compounds such as reaction products of ethylene glycol and adipic acid and reaction products of butylene glycol and adipic acid; polycarbonate polyol compounds; polycaprolactone polyol compounds; and the like. Alternatively, tri-functional propylene glycol added with an ethylene oxide can also be used. Among these, PTMG is preferable, and use of PTMG and DEG in combination is also preferable. The number average molecular weight (Mn) of PTMG is preferably 500 to 2000, more preferably 600 to 1300, and even more preferably 650 to 1000. The number average molecular weight can be measured by gel permeation chromatography (GPC). Note that when the number average molecular weight of the polyol compound is measured from the polyurethane resin, the number average molecular weight may be estimated by GPC after each component is decomposed by a conventional method such as amine decomposition.

The first polyol compound (C) may be used alone or a plurality of the polyol compounds may be used in combination.

(NCO Equivalent of Prepolymer)

In addition, the NCO equivalent of the prepolymer which is obtained by "(the parts by mass of the polyisocyanate compound (B)+the parts by mass of the polyol compound (C))/[(the number of functional groups per molecule of the polyisocyanate compound (B)×the parts by mass of the polyisocyanate compound (B)/the molecular weight of the polyisocyanate compound (B))−(the number of functional groups per molecule of the polyol compound (C)×the parts by mass of the polyol compound (C)/the molecular weight of the polyol compound (C))]" is a numerical value indicating the molecular weight of the PP (prepolymer) per NCO group. The NCO equivalent is preferably 200 to 800, more preferably 300 to 700, even more preferably 350 to 600, and particularly preferably 400 to 500.

[(D) Curing Agent]

In the manufacturing method of the present invention, a curing agent (also referred to as a chain extender) is mixed with a polyurethane bond-containing isocyanate compound and the like in the mixing step. By adding a curing agent, the terminal of the main chain of the polyurethane bond-containing isocyanate compound as the prepolymer is bound to the curing agent to form a polymer chain and be cured in the following molded body-forming step.

As the curing agent, for example, polyamine compounds and/or polyol compounds may be used.

The curing agent is added in an amount of preferably 10 to 60 parts by mass, more preferably 20 to 50 parts by mass, even more preferably 20 to 40 parts by mass, and further more preferably 30 to 40 parts by mass, relative to 100 parts by mass of the prepolymer.

((D-1) Polyamine Compound)

In the Specification and the Claims, the polyamine compound means a compound having two or more amino groups in a molecule thereof.

As the polyamine compound (D-1) (sometimes referred to as component (D-1)), aliphatic and aromatic polyamine compounds, in particular, diamine compounds may be used, which include, for example, ethylenediamine, propylenediamine, hexamethylenediamine, isophoronediamine, dicyclohexylmethane-4,4'-diamine, 3,3'-dichloro-4,4'-diaminodiphenylmethane (methylenebis-o-chloroaniline) (hereinafter, abbreviated as MOCA), polyamine compounds having structures similar to that of MOCA, and the like. In addition, the polyamine compound may have a hydroxyl group, and such amine-based compounds include, for example, 2-hydroxy ethyl ethylene diamine, 2-hydroxyethylpropylenediamine, di-2-hydroxy ethyl ethylenediamine, di-2-hydroxyethylpropylenediamine, 2-hydroxypropylethylenediamine, di-2-hydroxypropylethylenediamine, and the like.

As the polyamine compound, diamine compounds are preferable, MOCA, diamino diphenyl methane, and diaminodiphenyl sulfone are more preferable, and MOCA is particularly preferable.

Here, as MOCA, solid MOCA and crude MOCA are known. The solid MOCA means MOCA that is in the form of a solid at room temperature. The solid MOCA includes, for example, PANDEX E (manufactured by DIC), IHARACUAMINE-MT (manufactured by KUMIAI CHEMICAL INDUSTRY CO., LTD), and the like. The crude MOCA is a mixture of a monomer of MOCA and a multimer of MOCA, and one in which the ratio of the multimer is 15% by mass or more is preferably used. Such crude MOCA includes, for example, PANDEX E-50 (manufactured by DIC), LM-52 AMINE (manufactured by KUMIAI CHEMICAL INDUSTRY CO., LTD), and the like. The ratio of the multimer is more preferably 10 to 50% by mass, and even more preferably 20 to 40% by mass. The multimer includes a trimer and a tetramer of MOCA, and the like. With the crude MOCA, the reaction rate is easy to control, and as a result, it is easy to obtain the uniformity in physical properties (for example, density, hardness, and the like) of the entire foam.

In the Specification and the Claims, when "solid MOCA" and "crude MOCA" are used, they mean the above-described solid MOCA and crude MOCA, respectively.

The polyamine compound (D-1) may be used alone or a plurality of the polyamine compounds (D-1) may be used in combination.

To make it easy to mix the polyamine compound (D-1) with the other components and/or to improve the uniformity in cell size in the following molded body-forming step, the polyamine compound (D-1) is preferably defoamed under reduced pressure while being heated as necessary. As the defoaming method under reduced pressure, a method publicly known in the manufacture of polyurethane may be used, and for example, the defoaming may be performed under a vacuum of 0.1 MPa or less using a vacuum pump.

When a solid compound is used as the curing agent (chain extender), the curing agent (chain extender) may be defoamed under reduced pressure while being melted by heating.

The polyamine compound (D-1) is added in an amount of preferably 10 to 50 parts by mass, more preferably 15 to 40 parts by mass, and even more preferably 20 to 30 parts by mass, relative to 100 parts by mass of the prepolymer.

((D-2) Polyol Compound that May be Used after Synthesis of Prepolymer)

In addition, in the present invention, a polyol compound (D-2) may be used as the curing agent besides the polyol compound (C), which is used to form the isocyanate group-containing compound as the prepolymer.

As the polyol compound (D-2), compounds such as diol compounds and triol compounds may be used without particular limitation. Moreover, the polyol compound (D-2) may be the same as or different from the polyol compound (C), which is used to form the prepolymer.

Specific examples of the polyol compound (D-2) include low molecular weight diols such as ethylene glycol, diethylene glycol, triethylene glycol, 1,2-propane diol, 1,3-propane diol, 1,3-butanediol, 1,4-butanediol, neopentyl glycol, pentanediol, 3-methyl-1,5-pentanediol, and 1,6-hexanediol and high molecular weight polyol compounds such as poly(oxytetramethylene) glycol, polyethylene glycol, and polypropylene glycol, and the like. Among these, polypropylene glycol is preferable, polypropylene glycol having a number average molecular weight of 1000 to 3000 is more preferable, and polypropylene glycol having a number average molecular weight of 1500 to 2500 is even more preferable.

The polyol compound (D-2) may be used alone or a plurality of the polyol compounds (D-2) may be used in combination.

The polyol compound (D-2) is added in an amount of preferably 0 to 15 parts by mass, more preferably 5 to 15 parts by mass, and even more preferably 5 to 10 parts by mass, relative to 100 parts by mass of the prepolymer.

As the curing agent (D), the polyamine compound (D-1) may be used, or the polyol compound (D-2) may be used, or a mixture of these may be used. Among these, it is preferable to use the polyamine compound (D-1) and the polyol compound (D-2) in combination.

(r Value)

In the method for manufacturing a polishing pad of the present invention, the components are preferably mixed such that the r value which is the equivalent ratio of active hydrogen groups (amino groups and hydroxyl groups) present in the curing agent (D) to the isocyanate groups present in the terminals in the polyurethane bond-containing isocyanate compound (A) as the prepolymer becomes 0.70 to 1.30, and the r value is more preferably 0.75 to 1.20, even more preferably 0.80 to 1.10, further more preferably 0.80 to 1.00, and still further more preferably 0.85 to 0.95.

When the r value is within the above-described ranges, it becomes easy to obtain a polishing pad capable of reducing generation of polishing scratches and also excellent in polishing rate.

[(E) Hollow Body]

In the method for manufacturing a polishing pad of the present invention, it is preferable to enclose substantially spherical cells inside the polyurethane resin-molded body by using hollow bodies.

As the hollow bodies, hollow bodies having an average particle size of 10 to 150 μm is preferable. The average particle size of the hollow bodies is more preferably 15 to 130 even more preferably 20 to 100 further more preferably 20 to 60 and particularly preferably 30 to 50

Note that the average particle size can be measured by a laser diffraction particle size distribution measurement device (for example, Mastersizer 2000 manufactured by Spectris plc).

The hollow bodies are added in an amount of preferably 0.1 to 10 parts by mass, more preferably 1 to 5 parts by mass, and even more preferably 1 to 3 parts by mass, relative to 100 parts by mass of the prepolymer.

In addition, besides the above-described components, a conventionally used blowing agent may be used in combination with the hollow microspheres, and a non-reactive gas may be blown to the above-described components during the mixing step described below, as long as these do not hinder the effects of the present invention. The blowing agent includes water and a blowing agent comprising a hydrocarbon having 5 or 6 carbon atoms as a main component. The hydrocarbon includes, for example, chain hydrocarbons such as n-pentane and n-hexane and alicyclic hydrocarbon such as cyclopentane and cyclohexane.

In addition, besides the above-described components, a publicly-known foam stabilizer, flame retardant, colorant, plasticizer, and the like may be added.

In the mixing step, at least the polyurethane bond-containing isocyanate compound (A) as the prepolymer and the curing agent (D) are supplied into a mixer, followed by agitating and mixing. In addition, when the hollow bodies (E) are contained, at least the polyurethane bond-containing isocyanate compound (A) as the prepolymer, the curing agent (D), and the hollow bodies (E) are supplied into the mixer, followed by agitating and mixing. The order of mixing is not particularly limited, but it is preferable to first mix the polyurethane bond-containing isocyanate compound (A) and the hollow bodies and then supply this mixture together with the curing agent (D) and another component as necessary into the mixer. In this way, the mixture liquid for forming a molded body is prepared. The mixing step is carried out with the temperature increased to a temperature that allows the fluidity of the above-described components to be secured.

For example, the prepolymer (polyurethane bond-containing isocyanate) solution containing the hollow bodies and heated to 30° C. to 90° C. and the curing agent may be introduced into a jacketed mixer with an adjustable temperature, followed by agitating at 30° C. to 130° C. The mixture liquid may be placed in a tank with a jacketed mixer and aged as necessary. The agitation time is adjusted as appropriate depending on the number of teeth, the number of revolutions, the clearance, and the like of the mixer, but may be, for example, 1 to 60 seconds.

<Molded Body-Forming Step>

In the molded body-forming step, the mixture liquid for forming a molded body, which is prepared in the mixing step, is poured into a mold form that has been preheated to 30 to 100° C., followed by heating and curing at about 100 to 150° C. for about 10 minutes to 5 hours to mold the polyurethane resin. At this time, the prepolymer and the curing agent react to form the polyurethane resin, so that the mixture liquid is cured in the state where the bubbles of carbon dioxide, generated during polymerization of urethane, and the hollow bodies are dispersed in the resin. In this way, the polyurethane resin-molded body containing many substantially spherical cells is formed.

The polyurethane resin-molded body obtained in the molded body-forming step is then sliced into the form of sheets to form polyurethane sheets. Slicing provides pores in the surfaces of the sheets. To form pores that are excellent in wear resistance and unlikely to be clogged in the surface of the polishing layer, the sheets may be aged at 30 to 150° C. for approximately 1 hour to 24 hours.

Thereafter, a double-sided tape is applied to the surface opposite to the polishing surface of the polishing layer having the polyurethane sheet thus obtained, and the polishing layer is cut into a predetermined shape, preferably a circular shape to be completed as the polishing pad of the present invention. The double-sided tape is not particularly limited, and it is possible to select and use any one of double-sided tapes publicly known in the art.

In addition, the polishing pad of the present invention may have a single-layer structure composed only of the polishing layer or may have a multilayer in which another layer (a lower layer or a support layer) is applied to the surface opposite to the polishing surface of the polishing layer. The properties of another layer are not particularly limited. When a layer that is softer (has an A hardness or D hardness smaller) than the polishing layer is applied to the opposite surface of the polishing layer, the polishing planarity is further improved. On the other hand, a layer that is harder (has an A hardness or D hardness larger) than the polishing layer is applied to the opposite surface of the polishing layer, the polishing rate is further improved.

When the polishing pad has a multilayer structure, the plurality of layers may be bonded and fixed using a double-sided tape or an adhesive while being pressurized as necessary. The double-sided tape or adhesive used at this time is not particularly limited, and it is possible to select and use any of double-sided tapes and adhesives publicly known in the art.

Furthermore, if necessary, the polishing pad of the present invention may be subjected to a grinding on the front surface and/or the back surface of the polishing layer, and may be subjected to the grooving, embossing, or boring (punching) on the front surface. A substrate and/or an adhesive layer may be laminated on the polishing layer, and the polishing pad may include a light-transmitting portion.

The grinding method is not particularly limited, and grinding is carried out by a publicly-known method. Specifically, grinding using a sandpaper may be employed.

The pattern of the grooving and the embossing is not particularly limited, and includes, for example, a lattice pattern, concentric-circular pattern, a radial pattern, and the like.

When the polishing pad of the present invention is used, the polishing pad is attached to the turn table of the polishing machine such that the polishing surface of the polishing layer face a material to be polished. Then, the turn table is rotated to polish the machined surface of the material to be polished while the polishing slurry is being supplied.

<Action and Effects>

The polishing pad of the present invention is capable of reducing generation of scratches while maintaining a high polishing rate. The reason for this is not clear but may be assumed as below.

The polishing pad of the present invention is such that the storage modulus is smaller in the case where the relative humidity is high than in the case where the relative humidity is low. It is considered that when a material to be polished is polished using the polishing pad, the polishing slurry supplied makes the relative humidity very high particularly at the polishing surface of the polishing pad, and the polishing surface of the polishing pad falls into a state where the relative humidity is higher than that in the inside of the polishing pad. It is considered that since the polishing pad of the present invention is capable of making the storage modulus of the polishing surface where the relative humidity is very high smaller than the storage modulus in the inside of the polishing pad where the relative humidity is not so high, and accordingly the polishing surface becomes softened, so that the generation of polishing scratches can be suppressed. On the other hand, it is considered that since the inside of the polishing pad remains hard as compared with the polishing surface, so that an appropriate polishing rate can be maintained.

EXAMPLES

Hereinafter, the present invention is described in further detail with Examples, but the present invention is not limited by these Examples.

In each Example and Comparative Example, "part" means "part by mass" unless otherwise specified.

In addition, the NCO equivalent is a numerical value indicating the molecular weight of the prepolymer (PP) per NCO group, which is obtained by "(the mass (part) of the polyisocyanate compound (B)+the mass (part) of the polyol compound (C))/[(the number of functional groups per molecule of the polyisocyanate compound (B)×the mass (part) of the polyisocyanate compound (B)/the molecular weight of the polyisocyanate compound (B))−(the number of functional groups per molecule of the polyol compound (C)×the mass (part) of the polyol compound (C)/the molecular weight of the polyol compound (C))]".

The r value is, as described above, a numerical value indicating the equivalent ratio of active hydrogen groups (amino groups and hydroxyl groups) present in the curing agent to the terminal isocyanate groups in the prepolymer.

Example 1

To 100 parts of an isocyanate group terminal urethane prepolymer in a NCO equivalent of 460 obtained by reacting 2,4-tolylene diisocyanate (TDI), poly(oxytetramethylene)

glycol (PTMG), and diethylene glycol (DEG), 1.7 parts of expanded hollow microspheres (under the trade name of EXPANCEL 551 DE 40 d42 (manufactured by Expancel)) which had shell portions made of an acrylonitrile-vinylidene chloride copolymer, had an isobutane gas enclosed in the shells, and had a particle size of 30 to 50 µm were added and mixed to obtain a mixture liquid. The obtained mixture liquid was loaded into a first liquid tank and was kept at a temperature of 80° C. Next, separately from the first liquid, as a curing agent, 17 parts of solid MOCA, 8.5 parts of crude MOCA, and 8.5 parts of polypropylene glycol (PPG) were added and mixed and kept in a second liquid tank at a temperature of 120° C. The liquids in the respective first liquid tank and second liquid tank were injected into a mixer including two injection ports through the respective injection ports such that the r value indicating the equivalent ratio of the amino groups and hydroxyl groups present in the curing agent to the terminal isocyanate groups in the prepolymer became 0.90. The injected two liquids were, while being mixed and agitated, injected into a mold of a molding machine preheated to 100° C., and then the mold was closed, followed by heating at 110° C. for 30 minutes and primary curing. The primarily cured molded product was removed from the mold and was then secondarily cured in an oven at 130° C. for 2 hours to obtain an urethane molded product. The obtained urethane molded product was cooled down to 25° C. and was then again heated in the oven at 120° C. for 5 hours, followed by slicing into a thickness of 1.3 mm to obtain a polishing pad.

Example 2

With the first liquid, 2 parts of 4,4'-methylene-bis(cyclohexyl isocyanate) (hydrogenated MDI) was further mixed, and as the second liquid, a mixture liquid of 19.6 parts of solid MOCA and 8.4 parts of crude MOCA was used, then a polishing pad was fabricated and obtained by the same method as in Example 1.

Example 3

A polishing pad was fabricated and obtained in the same method as in Example 2 except that the particle size of hollow microspheres was changed to 90 to 130 µm (under the trade name of Matsumoto Microsphere F-80DE (manufactured by Matsumoto Yushi-Seiyaku Co., Ltd.)).

Comparative Example 1

In Comparative Example 1, a polishing pad manufactured by Nitta Haas Incorporated under the trade name of IC1000 was used.
(Storage Modulus and KEL)
For each Example and Comparative Example described above, the polishing pad (polyurethane sheet) that has been exposed to an environment with a temperature of 23° C. and a relative humidity of 90% or 30% was taken out, and the storage modulus E'(90%) or E'(30%) at 40° C. was obtained. In addition, the polishing pad (polyurethane sheet) that has been exposed to an environment with a temperature of 23° C. and a relative humidity of 90% or 30% was taken out, and KEL(90%) or KEL(30%) at 40° C. was obtained. Specific measuring methods are described below.
(Storage Modulus)
The storage modulus (MPa) and tan δ were measured for test pieces of 4×0.5×0.125 mm at 40° C. and a relative humidity of 90% or 30% with an initial load of 148 g, a strain range of 0.1%, and a measurement frequency of 1.6 Hz pursuant to JIS K7244-4 using TA Instruments Japan RSA III.
Note that specific measurement conditions are as described below.
Measuring device: TA Instruments Japan RSA III
Test mode: tension, temperature dispersion
Test piece: 4×0.5×0.125 cm
Frequency: 1.6 Hz
Initial load: 148 g
Temperature: 40° C.
Strain range: 0.1%
In addition, the temperature change was measured after the test pieces were stored in a constant-temperature and constant-humidity chamber for 40 hours or more before the measurement. In the constant-temperature and constant-humidity chamber, the measurement was conducted for each test piece with the temperature made constant at 23° C. (±2° C.) and the relative humidity fixed at 30% (±5%) or 90% (±5%).
KEL was calculated by the following equation based on the storage modulus E and tan δ obtained in the above-described measurements:

$KEL = \tan δ × 10^{12}/(E' × (1 + \tan δ^2))$.

Figure 2:
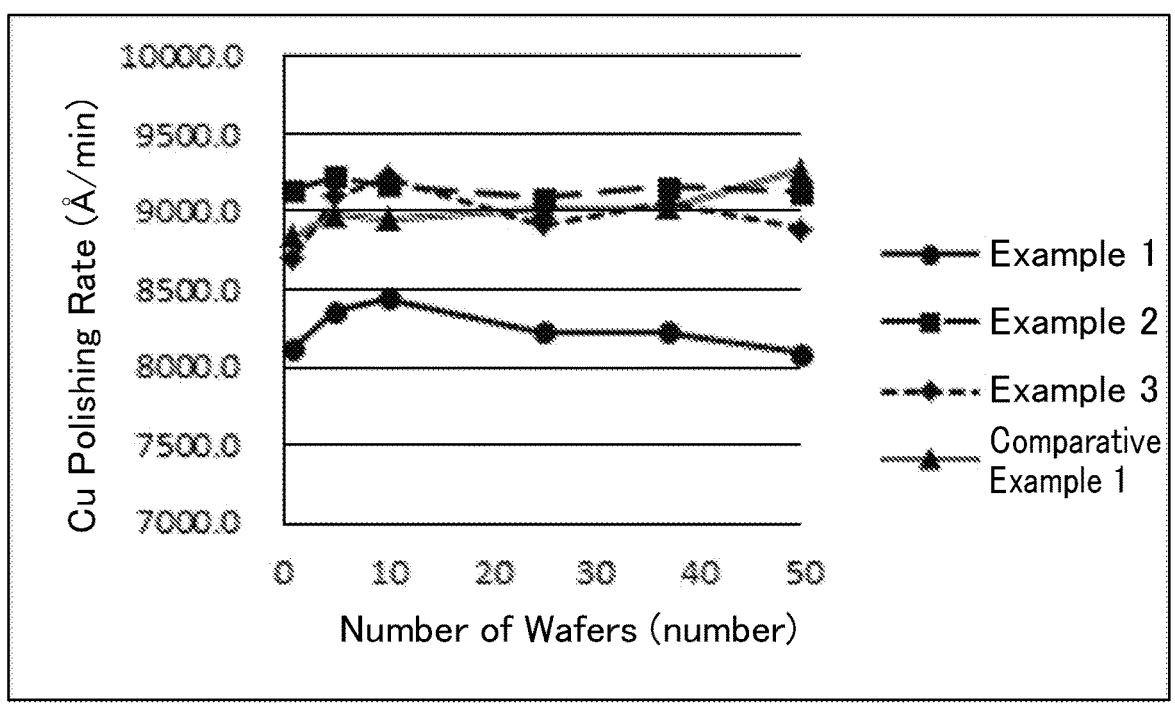
FIG. 2 is a graph illustrating polishing rates at predetermined numbers of substrates when 50 Cu film substrates were polished using the polishing pads of Examples 1 to 3 and Comparative Example 1.

The results are shown in Table. 1.
<Polishing Test>
For the polishing pad of each Example and Comparative Example, polishing was conducted under the following polishing conditions to measure the polishing rate and the numbers of polishing scratches generated. As the material to be polished, a substrate (hereinafter, a TEOS film substrate) in which an insulating film was formed of tetraethoxysilane in a thickness of 1 µm on a 12-inch silicon wafer by plasma CVD (PE-CVD) or a Cu-plated substrate (hereinafter, a Cu film substrate) was used.
(Polishing Rate)
The polishing rate represents the polished amount per minute with thickness (Å). The thickness was measured at 121 positions on the TEOS film or the Cu film on the wafer after the polishing and the average value of the thicknesses polished was obtained. The polishing rate (Å/min) was obtained by dividing the average value of the thicknesses polished by the polishing time. For each of the TEOS film substrate and the Cu film substrate, 50 substrates were polished and the polishing rates at predetermined numbers of substrates were studied. Note that the thickness measurement was conducted in DBS mode of an optical film-thickness and film-quality measuring device (manufactured by KLA Tencor, model number "ASET-F5x").
The polishing rates obtained by polishing the TEOS film and the Cu film using the polishing pads of Examples 1 to 3 and Comparative Example 1 are shown in FIGS. 1 and 2, respectively.
In addition, with the break-in taken into consideration, the average value of the polishing rates from 10 to 50 substrates is shown in Table 1 for each of the TEOS film substrate and the Cu film substrate.
(Number of Polishing Scratches (Scratches) Generated)
Regarding the number of polishing scratches generated, 50 substrates were polished for the TEOS film substrate and 31 substrates were polished for the Cu film substrate, and the number of polishing scratches generated in the surface of each substrate was obtained in WIDE Mode of Surfscan SP-1DLS (manufactured by KLA Tencor). Note that for the TEOS film substrate, the number of polishing scratches larger than 90 nm was measured while for the Cu film substrate, the number of polishing scratches (scratches and micro-scratches) larger than 115 nm was measured as defect numbers.

Note that polishing conditions used in the above-described tests are as described below.

Polishing machine used: F-REX300, manufactured by Ebara Corporation

Disk: C100, manufactured by Asahi Diamond Industrial Co., Ltd.

Number of revolutions: (turn table) 70 rpm, (top ring) 71 rpm

Polishing pressure: 3.5 psi

Temperature of polishing agent: 20° C.

Amount of polishing agent discharged: 200 ml/min

Note that the material to be polished and the polishing agent used are as described below.

<TEOS Film Polishing>

Workpiece used (material to be polished): A substrate in which an insulating film was formed of tetraethoxysilane in a thickness of 1 μm on a 12-inch-φ silicon wafer by plasma CVD (PE-CVD)

Polishing slurry: manufactured by Cabot Microelectronics, product number: SS25 (a mixture liquid in which undiluted solution:pure water=1:1 was used)

<Cu Film Polishing>

Workpiece used (material to be polished): Cu-plated substrate

Polishing agent: slurry for Cu, manufactured by Cabot Microelectronics

Figure 3:
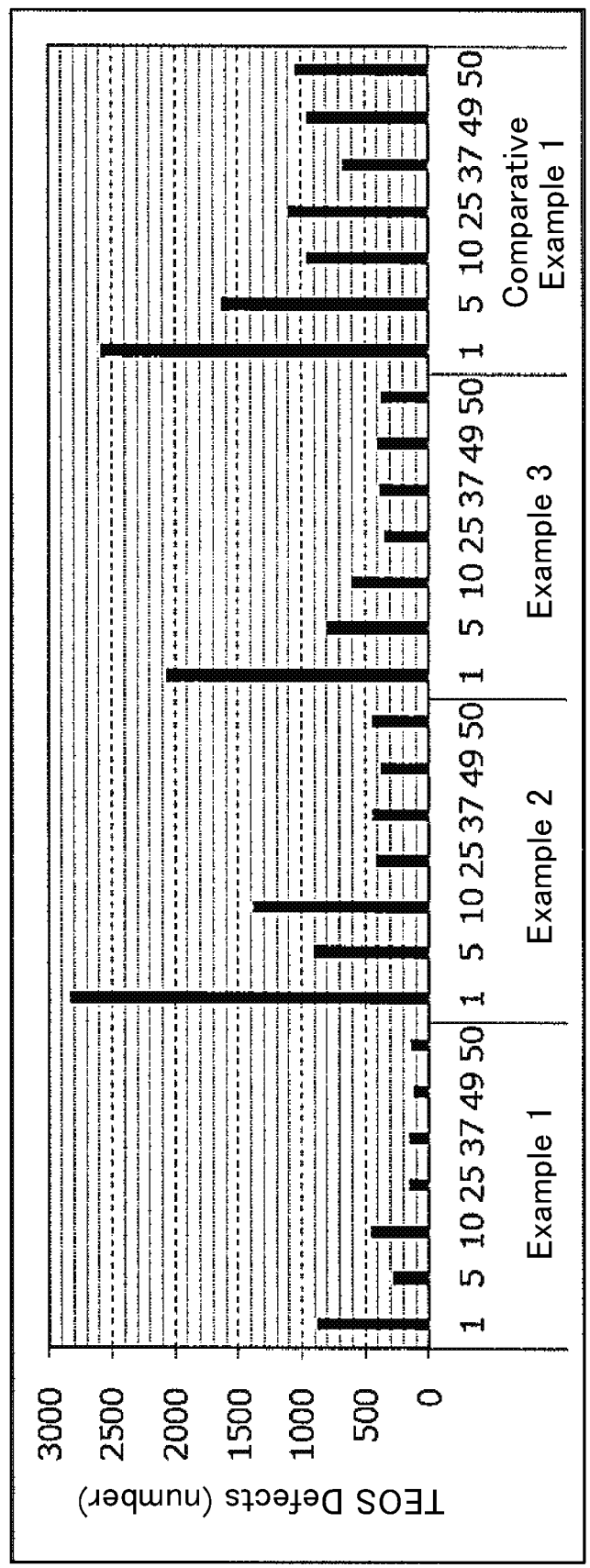
FIG. 3 is a graph illustrating numbers of polishing scratches generated at predetermined numbers of substrates when 50 TEOS film substrates were polished using the polishing pads of Examples 1 to 3 and Comparative Example 1.
Figure 4:
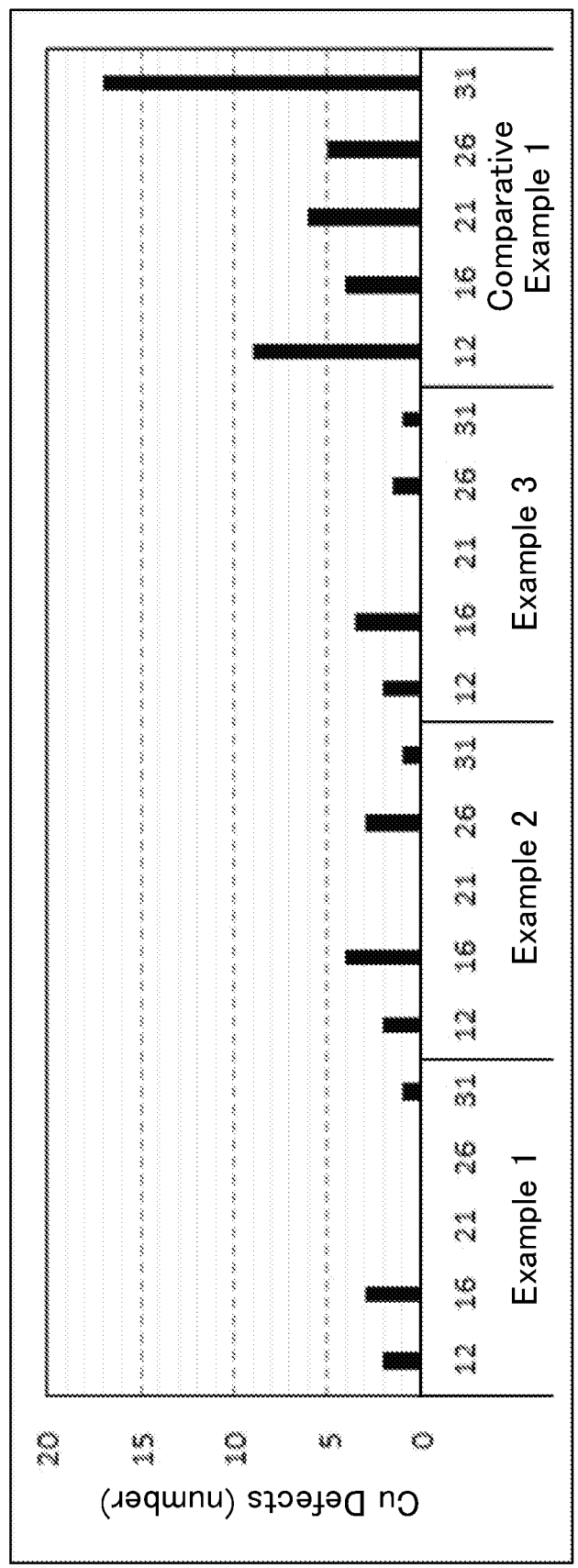
FIG. 4 is a graph illustrating numbers of polishing scratches generated at predetermined numbers of substrates when 31 Cu film substrates were polished using the polishing pads of Examples 1 to 3 and Comparative Example 1.

The defect numbers obtained by polishing TEOS films and Cu films using the polishing pads of Examples 1 to 3 and Comparative Example 1 are shown in FIGS. 3 and 4, respectively.

In addition, with the break-in taken into consideration, the average value of defect numbers from 10 to 50 substrates is shown in Table 1 for each of the TEOS film substrate and the Cu film substrate.

TABLE 1

|  | Example 1 | Example 2 | Example 3 | Comparative Example 1 |
|---|---|---|---|---|
| E'(90%) | 164 | 292 | 248 | 237 |
| E'(30%) | 322 | 513 | 406 | 265 |
| E'(90%)/E'(30%) | 0.51 | 0.57 | 0.61 | 0.89 |
| KEL(90%) | 1154 | 593 | 650 | 431 |
| KEL(30%) | 342 | 168 | 222 | 281 |
| KEL(90%)/KEL(30%) | 3.37 | 3.53 | 2.93 | 1.53 |
| Polishing Rate (TEOS Film) Å/min | 2437 | 2491 | 2485 | 2498 |
| Number of Polishing Scratches Generated (TEOS Film) Number | 202 | 604 | 421 | 944 |
| Polishing Rate (Cu Film) Å/min | 8244 | 9131 | 9016 | 9065 |
| Number of Polishing Scratches Generated (Cu Film) Number | 1.2 | 2.0 | 1.6 | 8.2 |

As seen from Table 1 and FIG. 1 to FIG. 4, for each of the TEOS film and Cu film, the polishing pads of Examples 1 to 3 significantly reduced the numbers of polishing scratches generated as compared to Comparative Example 1, while the polishing rates of the polishing pads of Examples 1 to 3 were comparable to the polishing rate of the polishing pad of Comparative Example 1.

INDUSTRIAL APPLICABILITY

The polishing pad of the present invention is capable of reducing generation of scratches while maintaining a high polishing rate. Therefore, the polishing pad and a method for manufacturing the same of the present invention have industrial applicability.

What is claimed is:

1. A polishing pad comprising:
a polishing layer having a polyurethane sheet containing substantially spherical cells, wherein
E'(90%)/E'(30%) falls within a range of 0.5 to 0.62, where
E'(90%) represents a storage modulus of the polyurethane sheet that has been exposed to an environment with a temperature of 23° C. and a relative humidity of 90%, as measured in a tension mode at 40° C. with an initial load of 148 g, a strain range of 0.1%, and a measurement frequency of 1.6 Hz, and
E'(30%) represents a storage modulus of the polyurethane sheet that has been exposed to an environment with a temperature of 23° C. and a relative humidity of 30%, as measured in a tension mode at 40° C. with an initial load of 148 g, a strain range of 0.1%, and a measurement frequency of 1.6 Hz.

2. The polishing pad according to claim 1, wherein KEL(90%)/KEL(30%) falls within a range of 2 to 4, Where
KEL means energy loss factor defined by the following equation:

$KEL = \tan \delta \times 10^{12}/(E' \times (1 + \tan \delta^2))$, wherein tan δ is E''/E', E'' is a loss modulus and E' is a storage modulus,
KEL(90%) represents KEL of the polyurethane sheet that has been exposed to an environment with a temperature of 23° C. and a relative humidity of 90%, as measured in a tension mode at 40° C. with an initial load of 148 g, a strain range of 0.1%, and a measurement frequency of 1.6 Hz, and
KEL(30%) represents KEL of the polyurethane sheet that has been exposed to an environment with a temperature of 23° C. and a relative humidity of 30%, as measured in a tension mode at 40° C. with an initial load of 148 g, a strain range of 0.1%, and a measurement frequency of 1.6 Hz.

3. The polishing pad according to claim 1, wherein E'(30%) of the polyurethane sheet is 280 to 600 MPa.

4. The polishing pad according to claim 1, wherein KEL(90%) of the polyurethane sheet is 450 to 1500 1/Pa,
KEL means energy loss factor defined by the following equation:

$KEL = \tan \delta \times 10^{12}/(E' \times (1 + \tan \delta^2))$, wherein tan δ is E''/E', E'' is a loss modulus and E' is a storage modulus,
KEL(90%) represents KEL of the polyurethane sheet that has been exposed to an environment with a temperature of 23° C. and a relative humidity of 90%, as measured in a tension mode at 40° C. with an initial load of 148 g, a strain range of 0.1%, and a measurement frequency of 1.6 Hz.

5. The polishing pad according to claim 1, wherein
the polyurethane sheet contains hollow bodies having an average particle size 10 to 150 μm.

* * * * *